(12) United States Patent
Ho

(10) Patent No.: US 6,924,703 B2
(45) Date of Patent: Aug. 2, 2005

(54) AMPLIFIER CIRCUIT WITH A SHARED CURRENT SOURCE

(75) Inventor: Jih-Shin Ho, Kaohsiung (TW)

(73) Assignee: King Billion Electronics Co., Ltd., Hsinchu Hsien (TW)

(*) Notice: Subject to any disclaimer, the term of this patent is extended or adjusted under 35 U.S.C. 154(b) by 33 days.

(21) Appl. No.: 10/672,832

(22) Filed: Sep. 26, 2003

(65) Prior Publication Data

US 2005/0068109 A1 Mar. 31, 2005

(51) Int. Cl.[7] .................................................. H03F 3/68
(52) U.S. Cl. ..................................... 330/311; 330/310
(58) Field of Search ................................. 330/311, 310, 330/253, 254, 257, 261, 98, 150

(56) References Cited

U.S. PATENT DOCUMENTS 5,530,405 A * 6/1996 Rydel ........................... 330/278
6,147,559 A * 11/2000 Fong ............................ 330/311
6,246,290 B1 * 6/2001 Morrish et al. ............. 330/311

* cited by examiner

Primary Examiner—Henry Choe
(74) Attorney, Agent, or Firm—Alan D. Kamrath; Nikolai & Mersereau, P.A.

(57) ABSTRACT

An amplifier circuit with a shared current source a first amplifier, a second amplifier and a current source. The output of the first amplifier (10) is coupled to the current source (30). When the second amplifier (20) is cascaded onto the first amplifier (10), the current source (30) is also connected to the second amplifier (20), such that these two amplifiers can share a common drive current, so the power dissipated by these two amplifiers is greatly reduced. This technique is implemented with Class A amplifiers, Class B amplifiers, Class AB amplifiers or a combination of the above amplifiers in cascade.

14 Claims, 6 Drawing Sheets

US 6,924,703 B2

AMPLIFIER CIRCUIT WITH A SHARED CURRENT SOURCE

BACKGROUND OF THE INVENTION

1. Field of the Invention

The present invention relates to an amplifier circuit with a shared current source, in particular to an amplifier circuit with multiple cascaded stages of amplifiers that share a common current source to reduce power dissipation.

2. Description of Related Arts

In general, amplifiers may have a gain stage and an output stage. However, the driving capability of the gain stage is usually not enough to meet high power requirements, and a Class A amplifier usually needs an output stage to boost the output power when the amplifier is linked to a large load. Class A amplifiers can be further divided into a source type or a sink type.

With reference to FIGS. 7 and 8, source type and sink type Class A amplifiers have a gain stage (51) and an output stage (52). The main distinction between these two types of amplifiers is that the source type can provide large current output to back-end circuits, whereas the sink type takes in current. The output stage in both types of amplifiers needs a current source (53) to drive the current output. When the source type amplifier is not active, the source circuit still draws substantial electrical energy from the current source (53). To improve the operation efficiency of the amplifier and to remove noise in the circuits, the current source (53) in a source type amplifier is usually designed with high current output, hence the power dissipation is even greater.

In certain drive circuits (such as LCD devices), incorporating both a source type and a sink type amplifier side by side is necessary. The common practice is to put these two types of amplifier circuits in independently. When these two amplifier circuits are not active, their total power dissipation is twice that of a shared current source (53) since each circuit has its own current source. Therefore the amplifier circuit design needs to be improved to meet the increasing demand to save power.

SUMMARY OF THE INVENTION

The present invention provides an amplifier circuit that shares a common drive current by installing a single current source between two source type amplifiers to reduce their power dissipation.

To this end, the amplifier circuit includes a first amplifier and a second amplifier, and both have a gain stage and an output stage. The output stage of the first amplifier is coupled to a current source, and the second amplifier is cascaded onto the first amplifier with the current source being coupled to the output stage of the second amplifier. Therefore, both amplifiers share a common current source.

The common current source can be built with a current mirror circuit formed by either PMOS transistors or NMOS transistors.

The first amplifier can be either a Class A amplifier, Class B amplifier or a Class AB amplifier type.

The second amplifier can be either a Class A amplifier, Class B amplifier or a Class AB amplifier type.

The features and structure of the present invention will be more clearly understood when taken in conjunction with the accompanying drawings.

DETAILED DESCRIPTION OF THE PREFERRED EMBODIMENT

Figure 1:
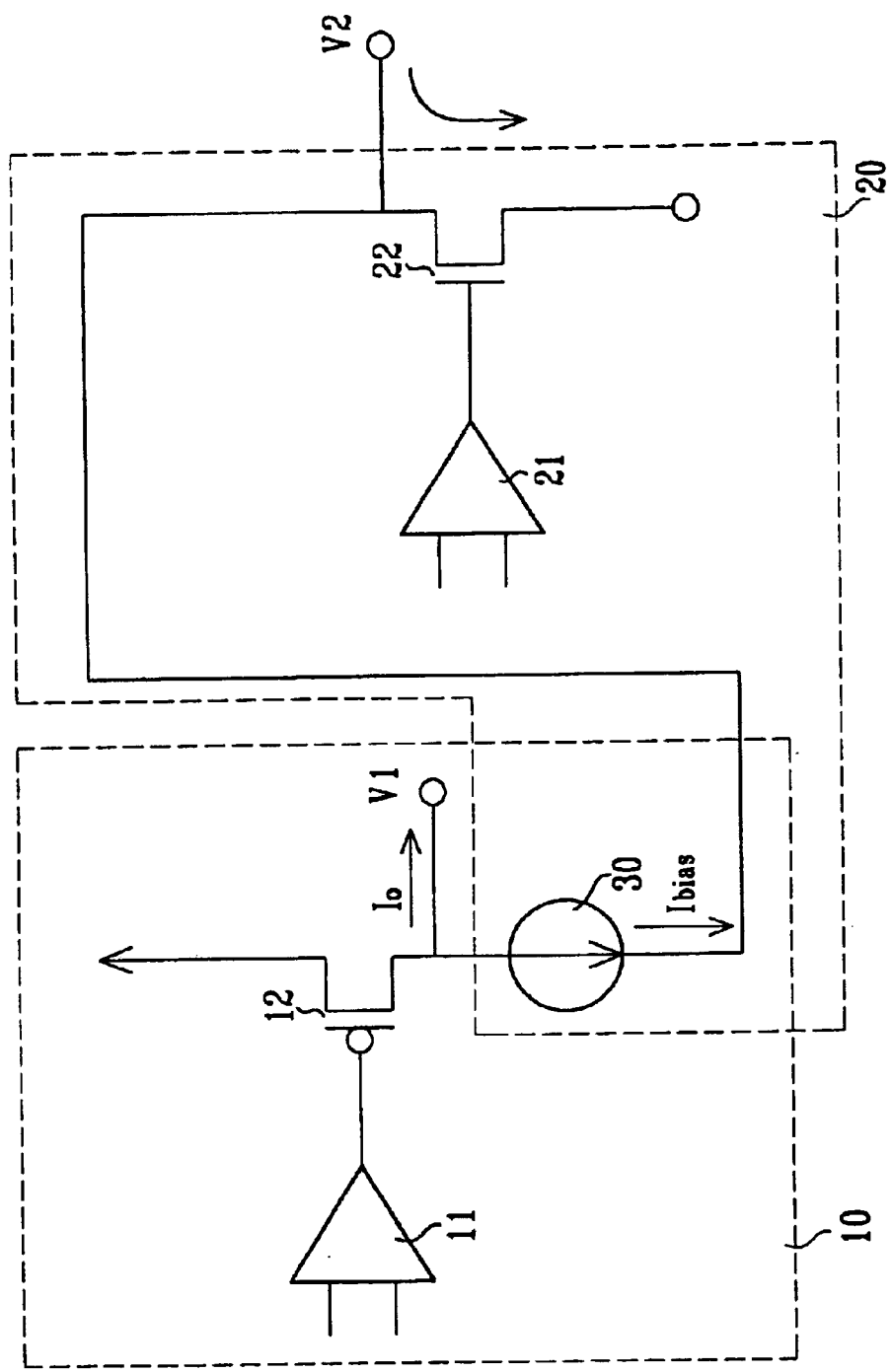
FIG. 1 is a schematic diagram of an amplifier circuit with a shared current source in accordance with the present invention.

With reference to FIG. 1, a first preferred embodiment of an amplifier circuit with a shared current source in accordance with the present invention comprises a first amplifier (10), a second amplifier (20) and a current source (30).

The first amplifier (10) is a source type Class A amplifier and has an output node (V1), a gain stage (11) and an output stage (12). The second amplifier (20) is a sink type Class A amplifier and has an output node (V2), a gain stage (21) and an output stage (22).

The current source (30) is coupled between the first and second amplifiers (10, 20) and simultaneously provides a drive current for the first amplifier (10) and the second amplifier (20).

When the first and second amplifiers (10) (20) are not in active mode, their power dissipation as a result of the shared current source design is only that of a single current source (30). Consequently, a 50% power saving is realized when compared to conventional techniques.

Figure 2:
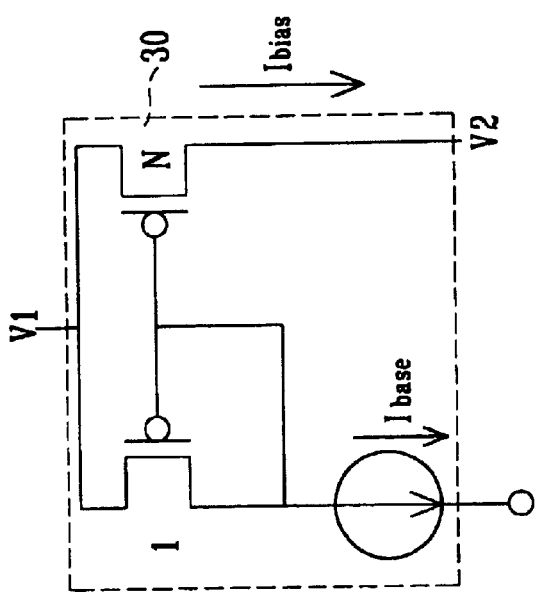
FIG. 2 is a schematic diagram of one implementation of the shared current source in an amplifier circuit with a shared current source.
Figure 3:
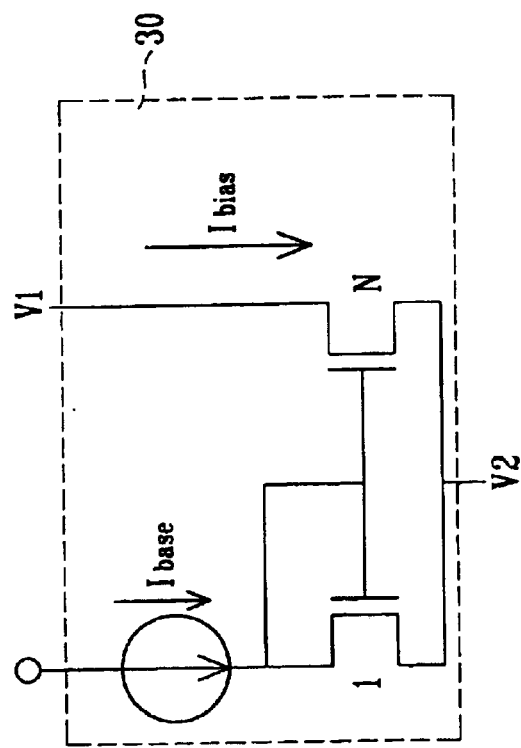
FIG. 3 is a schematic diagram of another implementation of the shared current source in another preferred embodiment of an amplifier circuit with a shared current source in accordance with the present invention.

With reference to FIGS. 2 and 3, the shared current source (30) is implemented by installing a current mirror circuit between the first and second amplifiers (10, 20). The current mirror circuit can be built with two PMOS or NMOS transistors (not numbered). Each current mirror utilizes a base current ($I_{base}$) on the current input side (not numbered). Through appropriate control of a current ratio (1:N) between the two transistors, making the current flow ($I_{bias}$) on the output side (not numbered) N times larger than the base current ($I_{base}$) is possible, that is $I_{bias}=N \times I_{base}$. This bias current ($I_{bias}$) is shared by the first and second amplifiers (10, 20).

Figure 4:
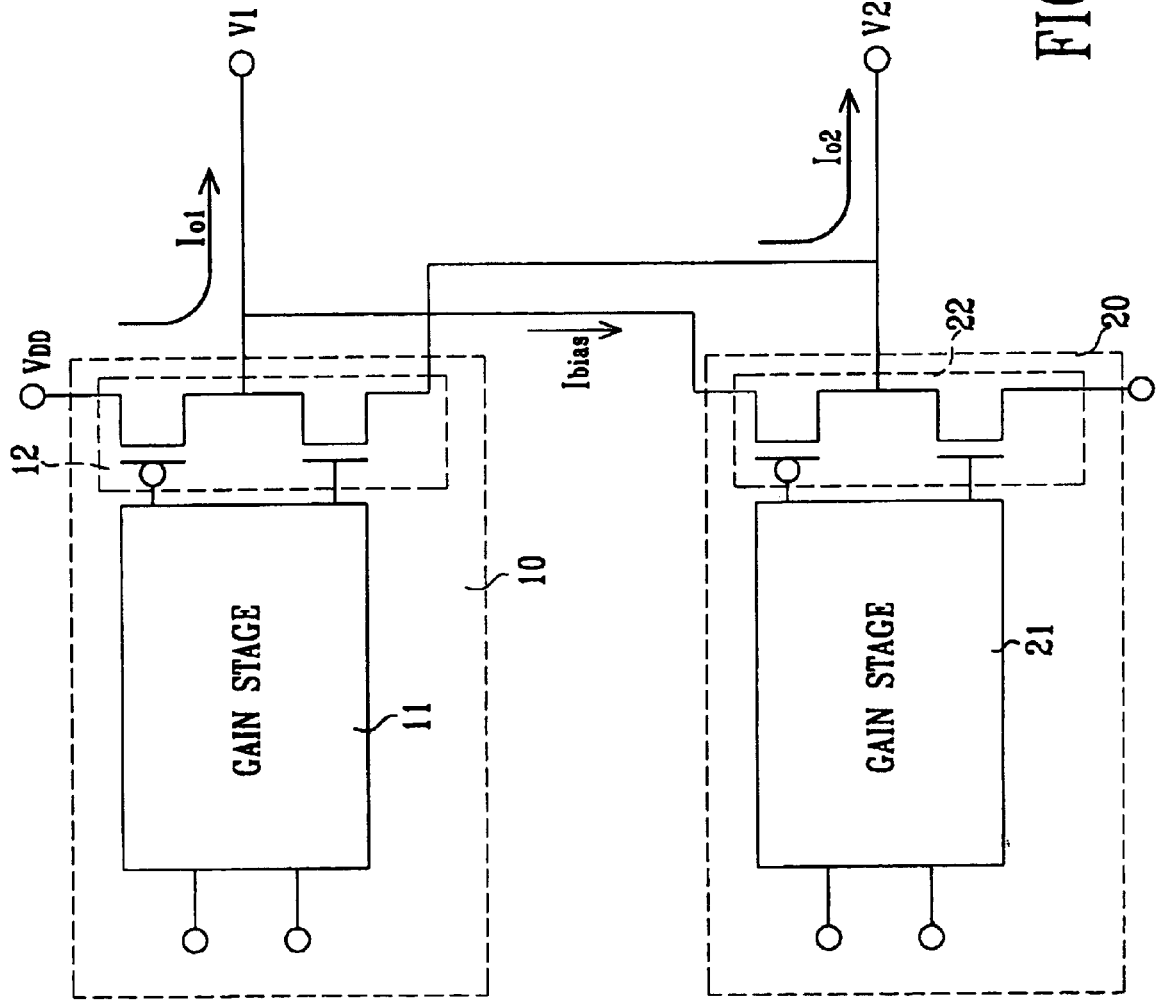
FIG. 4 is a schematic diagram of another preferred embodiment of the shared current source in an amplifier circuit with a shared current source in accordance with the present invention.

With reference to FIG. 4, the amplifier circuit with a shared current source in accordance with the present invention is not only applicable to cascading of Class A amplifiers, but also to Class B amplifiers, Class AB amplifiers or a combination of these amplifiers. The first and second amplifiers (10, 20) in this embodiment can be all Class B amplifiers or Class AB amplifiers (their circuits are identical). The drive current for the output stage (12) of the first amplifier (10) comes from the operation voltage ($V_{DD}$), and the drive current ($I_{bias}$) for the output stage (22) of the second amplifier (20) comes from the output current ($I_{O1}$) of the first amplifier (10), without using any additional operation voltage ($V_{DD}$).

Figure 5:
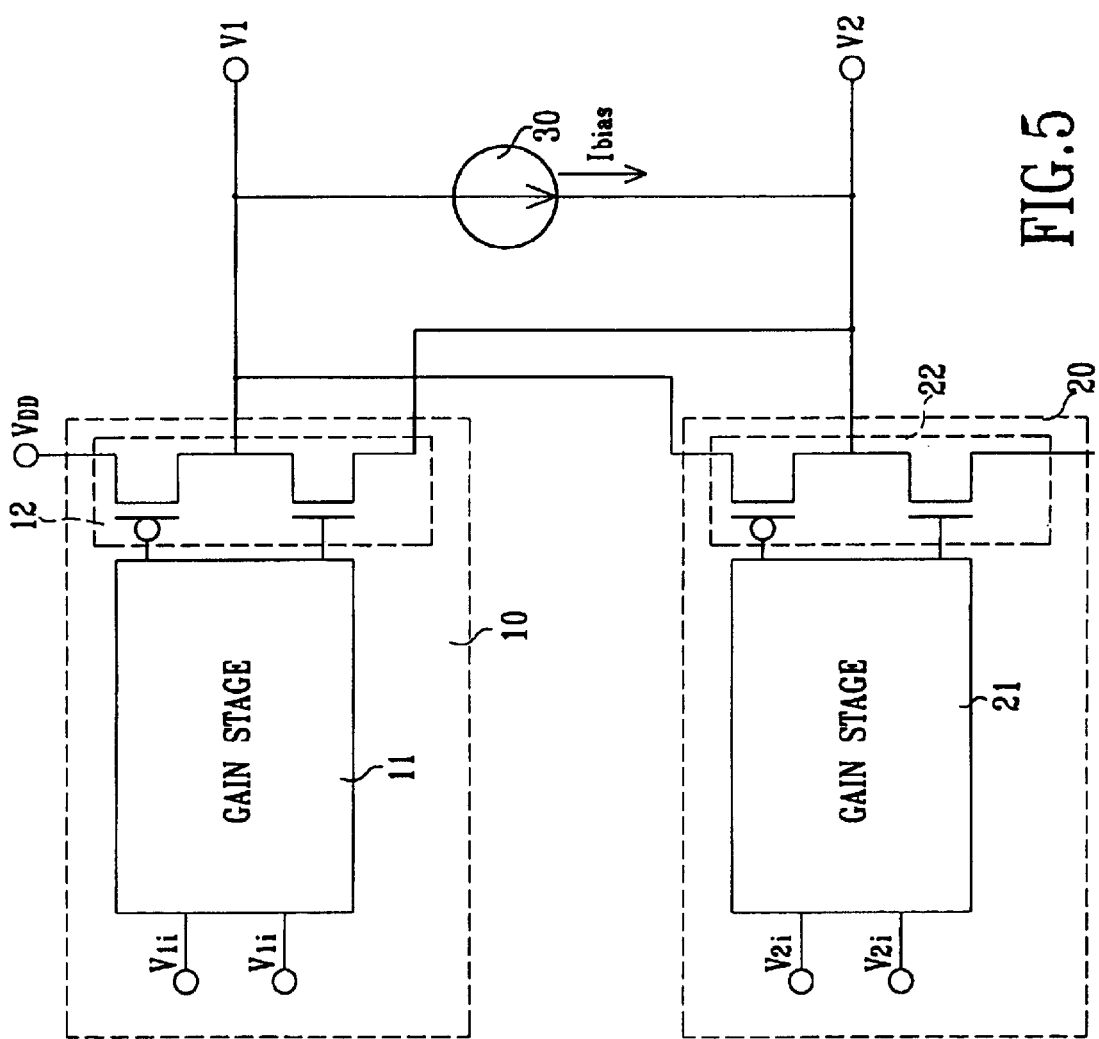
FIG. 5 is a schematic diagram of still another preferred embodiment an amplifier circuit with a shared current source in accordance with the present invention.
Figure 6:
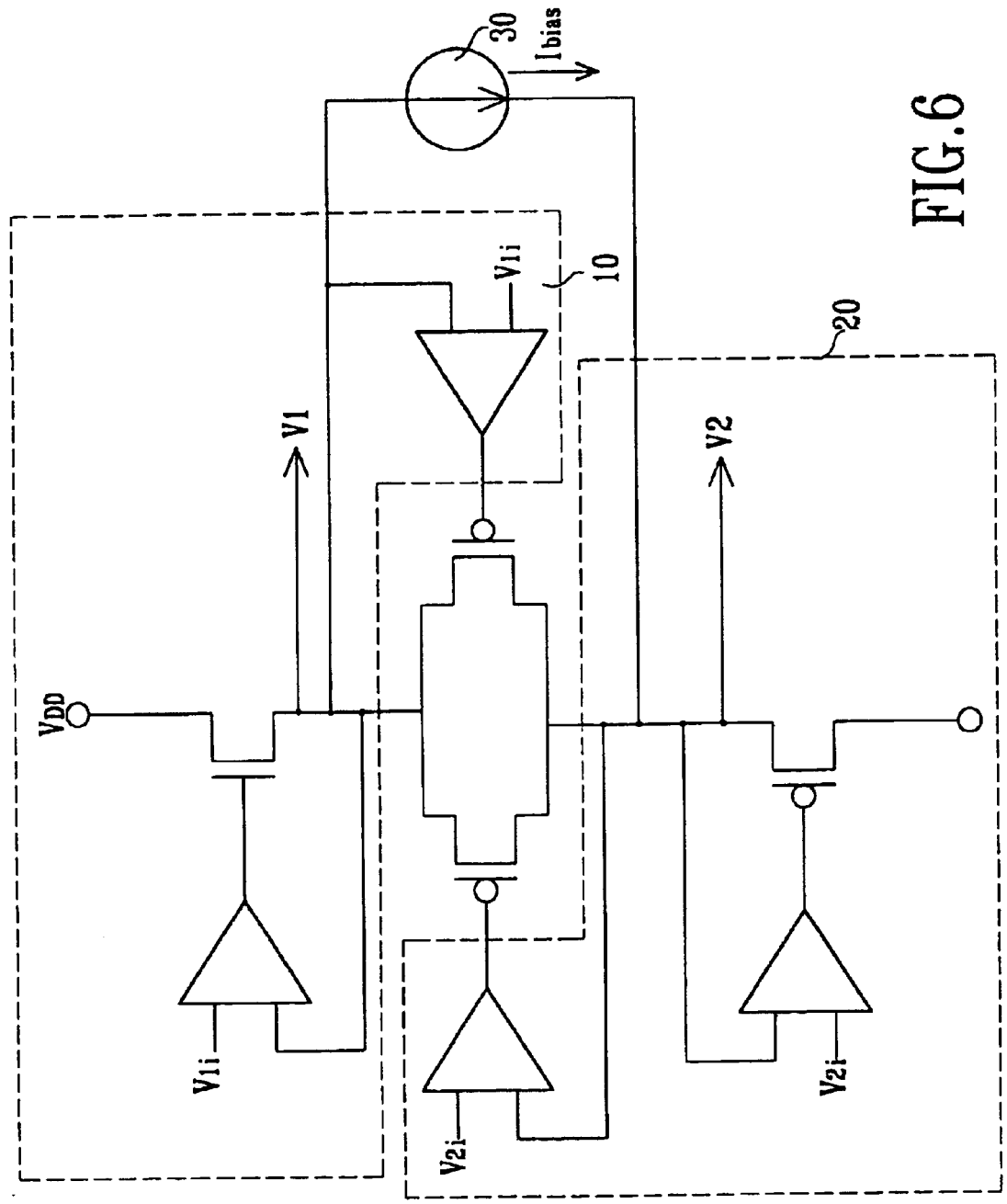
FIG. 6 is a detailed circuit diagram of the amplifier circuit in FIG. 5.
Figure 8:
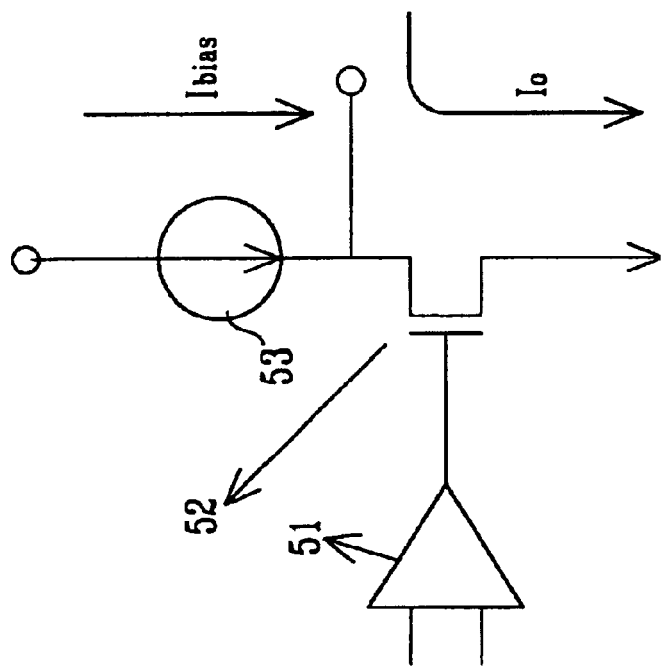
FIG. 8 is a schematic diagram of a conventional Class A amplifier (sink type).
Figure 7:
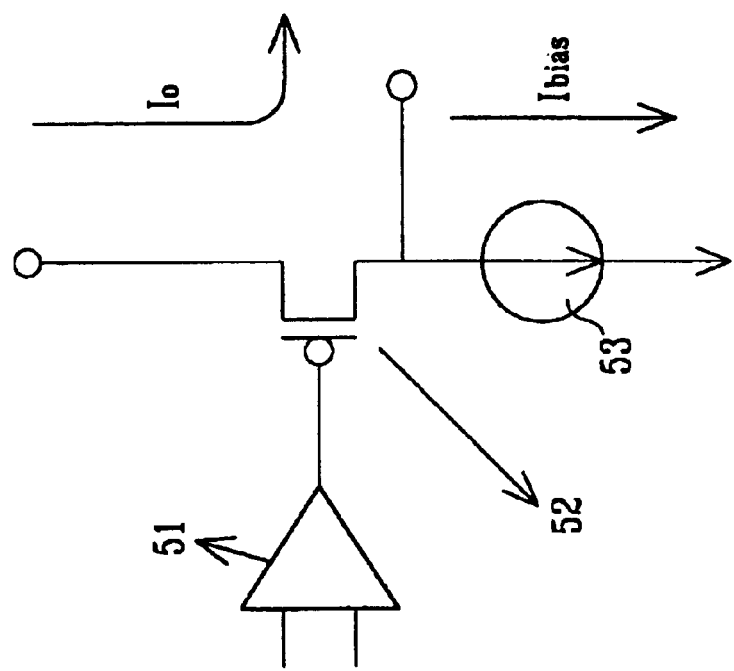
FIG. 7 is a schematic diagram of a conventional Class A amplifier (source type)

With reference to FIGS. 5 and 6, another embodiment of the amplifier circuit with a shared current source in accordance with the present invention has a Class A amplifier driving circuit combinable with a Class B amplifier (A+B) or a Class AB amplifier (A+AB). This is distinguished from the previous embodiments in that a shared current source (30) is installed in between the output nodes (V1, V2) of the first and second amplifiers (10, 20).

That the present invention can be used to construct an amplifier circuit with two amplifiers in cascade without having to set aside respective current sources independently is apparent. Therefore the power dissipated from these cascaded amplifiers when not in the active mode is only half of that using independent current sources. Besides the power saving, circuit layout of the present invention is simplier than the conventional techniques.

The foregoing description of the preferred embodiments of the present invention is intended to be illustrative only and, under no circumstances, should the scope of the present invention be so restricted

What is claimed is:

1. An amplifier circuit comprising a first amplifier; a second amplifier; and a current source, with each of the first and second amplifiers having a gain stage and an output stage, wherein the output stage of the first amplifier is coupled to the current source, and when the second amplifier is cascaded onto the first amplifier, the cascading causes the current source of the second amplifier to be connected in series to the output stage of the first amplifier to share the current source; and the current source is formed by a current mirror using two PMOS transistors.

2. An amplifier circuit comprising a first amplifier; a second amplifier; and a current source. with each of the first and second amplifiers having a gain stage and an output stage wherein, the output stage of the first amplifier is coupled to the current source, and when the second amplifier is cascaded onto the first amplifier, the cascading causes the current source of the second amplifier to be connected in series to the output stage of the first amplifier to share the current source; and the current source is formed by a current mirror using two NMOS transistors.

3. The amplifier circuit as claimed in claim 1, wherein the first amplifier is a Class A amplifier.

4. The amplifier circuit as claimed in claim 1, wherein the first amplifier is a Class B amplifier.

5. The amplifier circuit as claimed in claim 1, wherein the first amplifier is a Class AB amplifier.

6. The amplifier circuit as claimed in claim 2, wherein the first amplifier is a Class A amplifier.

7. The amplifier circuit as claimed in claim 2, wherein the first amplifier is a Class B amplifier.

8. The amplifier circuit as claimed in claim 2, wherein the first amplifier is a Class AB amplifier.

9. The amplifier circuit as claimed in claim 1, wherein the second amplifier is a Class A amplifier.

10. The amplifier circuit as claimed in claim 1, wherein the second amplifier is a Class B amplifier.

11. The amplifier circuit as claimed in claim 1, wherein the second amplifier is a Class AB amplifier.

12. The amplifier circuit as claimed in claim 2, wherein the second amplifier is a Class A amplifier.

13. The amplifier circuit as claimed in claim 2, wherein the second amplifier is a Class B amplifier.

14. The amplifier circuit as claimed in claim 2, wherein the second Amplifier is a Class AB amplifier.

* * * * *